United States Patent
Fukui et al.

(10) Patent No.: US 7,053,461 B2
(45) Date of Patent: May 30, 2006

(54) SEMICONDUCTOR DEVICE

(75) Inventors: Tsukasa Fukui, Nagaokakyo (JP); Kaoru Ishida, Shijonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/928,503

(22) Filed: Aug. 27, 2004

(65) Prior Publication Data
US 2005/0045989 A1 Mar. 3, 2005

(30) Foreign Application Priority Data
Sep. 1, 2003 (JP) ............................. 2003-309197

(51) Int. Cl.
H01L 29/00 (2006.01)
H01L 23/552 (2006.01)
(52) U.S. Cl. ...................... 257/531; 257/659; 257/758
(58) Field of Classification Search ................ 257/531, 257/659, 758
See application file for complete search history.

(56) References Cited

U.S. PATENT DOCUMENTS 5,534,727 A * 7/1996 Inoue ......................... 257/659
6,730,983 B1 * 5/2004 Minami ...................... 257/531
2004/0222506 A1 * 11/2004 Wei et al. ................... 257/686

FOREIGN PATENT DOCUMENTS

| JP | 2000-15802 | 5/2000 |
| JP | 2002-246547 | 8/2002 |
| JP | 2003-68862 | 3/2003 |

* cited by examiner

Primary Examiner—T. N. Quach
(74) Attorney, Agent, or Firm—Hamre, Schumann, Mueller & Larson, P.C.

(57) ABSTRACT

A semiconductor device includes: a semiconductor substrate in which a semiconductor element is formed; a multilayer structured wiring layer that is provided on the semiconductor substrate, the wiring layer forming a structure connected with the semiconductor element; a spiral inductor that is formed in at least one layer of the wiring layer; and a connection terminal formed in an uppermost layer of the wiring layer for establishing connection from the wiring layer to an outside such as a printed board. A shielding wiring pattern is disposed between the spiral inductor and the connection terminal, the shielding wiring pattern functioning as an electromagnetic shield for the uppermost layer of the wiring layer. The shielding wiring pattern absorbs a change in electrical field caused by a potential change in the connection terminal, providing a shielding structure which suppresses the superposing of noise and an unnecessary signal onto the spiral inductor from the connection terminal.

7 Claims, 6 Drawing Sheets

SEMICONDUCTOR DEVICE

FIELD OF THE INVENTION

The present invention relates to an electromagnetic shielding structure for a spiral inductor formed in a semiconductor device.

BACKGROUND OF THE INVENTION

In recent years, along with the progress of a semiconductor device with a higher integration degree and a higher density, a semiconductor device with a built-in inductance passive element, which was connected externally as a separate element in an earlier device, has become commercially practical. Such a highly integrated semiconductor device is required to satisfy mutually contradictory conditions so as to prevent the superposing of noise and an unnecessary signal on an electrical signal of a circuit and to allow for the arrangement of input/output wirings and terminals for a large number of circuit blocks that are highly integrated.

Referring to FIGS. 6 to 8, a configuration of a conventional semiconductor device with a built-in spiral inductor will be described below. FIG. 6 is a plan view, FIG. 7 is a cross-sectional view taken along line C–C' of FIG. 6 and FIG. 8 is a cross-sectional view taken along line D–D' of FIG. 6.

In FIG. 6, reference numeral 1 denotes a spiral inductor, around which connection terminals 2a, 2b and 2c leading to a printed board or the like are disposed. The spiral inductor 1 is connected with a circuit block 7 by way of a wiring 5 and a via 6 that is for the interlayer connection of the wiring layer. As shown in FIG. 7, the wiring 5 and the via 6 are formed at a multilayered wiring region 3 including a wiring layer and an insulation layer that are provided on a semiconductor substrate 4. As shown in FIG. 8, the spiral inductor 1 and the connection terminals 2a, 2b and 2c (FIG. 8 illustrates the connection terminal 2a only) are disposed on an upper surface of the multilayered wiring region 3.

As countermeasures against digital noise in such a configuration, a known configuration, for example, is such that electromagnetic shielding is provided so as to surround a spiral inductor 1, the shielding being formed across the entire multilayered region including a layer constituting the spiral inductor 1 (See JP 2003-68862 A, FIG. 1, for example).

In the configuration like the conventional example, however, in the case where any one of the connection terminals 2a to 2c functions as an input/output terminal through which an electrical signal passes or a connection terminal with high impedance, the spiral inductor is affected by noise and an unnecessary signal.

Furthermore, in order to eliminate the noise and the unnecessary signal, all of the connection terminals should have low impedance such as a ground level as shown by the connection terminal 2C. This imposes a considerable restriction on a layout configuration of the semiconductor device, which results in an increase in size of the semiconductor device.

Furthermore, in the case of the configuration described in JP 2003-68862 A, the size of the block constituting the spiral inductor becomes large because the entire multilayered wiring region is shielded around the spiral inductor. Additionally, this configuration imposes a restriction on a low-impedance wiring such as the ground also, so that the flexibility of wiring layout, which is an advantage of the multilayered wiring structure, is impaired, thus resulting in an increase in size of the semiconductor device.

SUMMARY OF THE INVENTION

Therefore, with the foregoing in mind, it is an object of the present invention to provide a semiconductor device having a shielding structure that is free from the influence of noise and an unnecessary signal even when a connection terminal adjacent to a spiral inductor is not a low impedance terminal and that does not impair the flexibility of wiring layout.

In order to cope with the above-stated problems, a semiconductor device of the present invention includes: a semiconductor substrate in which a semiconductor element is formed; a multilayer structured wiring layer that is provided on the semiconductor substrate, the wiring layer forming a structure connected with the semiconductor element; a spiral inductor that is formed in at least one layer of the wiring layer; and a connection terminal formed in an uppermost layer of the wiring layer for establishing connection from the wiring layer to an outside such as a printed board. A shielding wiring pattern is disposed between the spiral inductor and the connection terminal, the shielding wiring pattern functioning as an electromagnetic shield for the uppermost layer of the wiring layer.

DETAILED DESCRIPTION OF THE INVENTION

According to the configuration of the semiconductor device of the present invention, the influence of noise and an unnecessary signal on the spiral inductor can be suppressed even when a connection terminal adjacent to the spiral inductor is not a low impedance terminal such as the ground, and the flexibility of the wiring layout is not impaired, thus allowing the semiconductor device to be miniaturized.

In the semiconductor device of the present invention, preferably, the spiral inductor is formed in the uppermost layer of the wiring layer. A dielectric region that is an insulation layer below the spiral inductor can be made thicker because the spiral inductor is formed in the uppermost layer in the same manner as in the connection terminal. Therefore a Q value of the spiral inductor itself can be increased, and an excellent shielding effect by the shielding wiring pattern can be obtained.

Furthermore, preferably, at least two spiral inductors are provided, the two spiral inductors being arranged to be symmetric with respect to a predetermined center line, and the shielding wiring pattern being arranged to be symmetric with respect to the center line. As for a differential circuit, for example, symmetry is important regarding the circuit layout as well as the constituting device. With this configuration, the differential circuit having at least two spiral inductors can have symmetry regarding the shielding wiring pattern around the spiral inductors as well as the symmetry regarding the spiral inductors, and therefore favorable properties can be obtained.

The spiral inductor may be used as a resonant element of an oscillating circuit. In the oscillating circuit employing a spiral inductor as a resonant part, spurious signals and fluctuations of frequency tend to occur because of the superposing of noise and an unnecessary signal onto the resonant part. With the shielding configuration of the present invention, however, a small and stable oscillating circuit can be obtained.

The semiconductor device having any one of the above-described configurations can be applied to radio equipment. Thereby, radio equipment with stable properties can be obtained.

The following specifically describes embodiments of the present invention, with reference to the drawings.

EMBODIMENT 1

Figure 1:
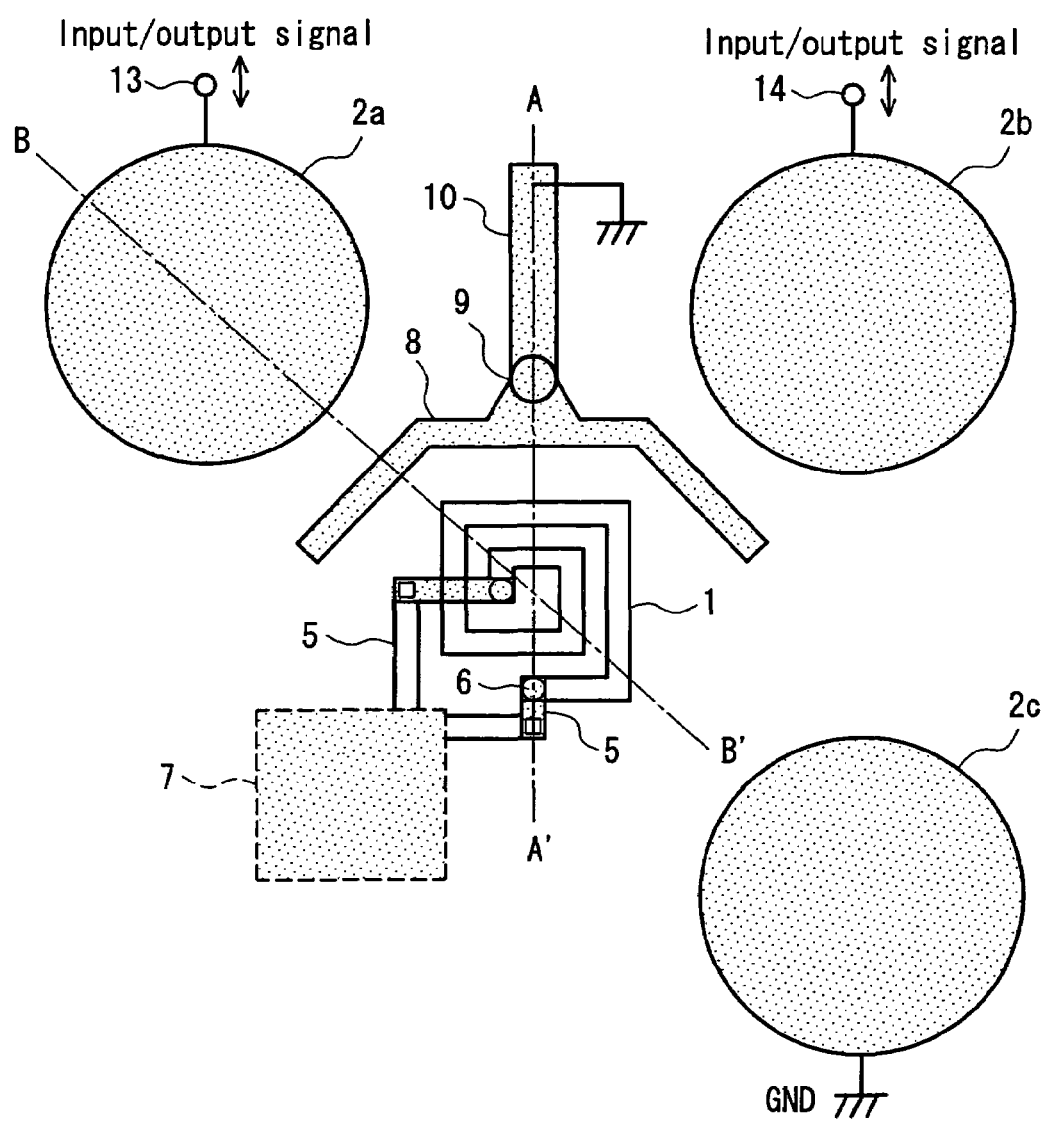
FIG. 1 is a plan view of a semiconductor device according to Embodiment 1 of the present invention.
Figure 2:
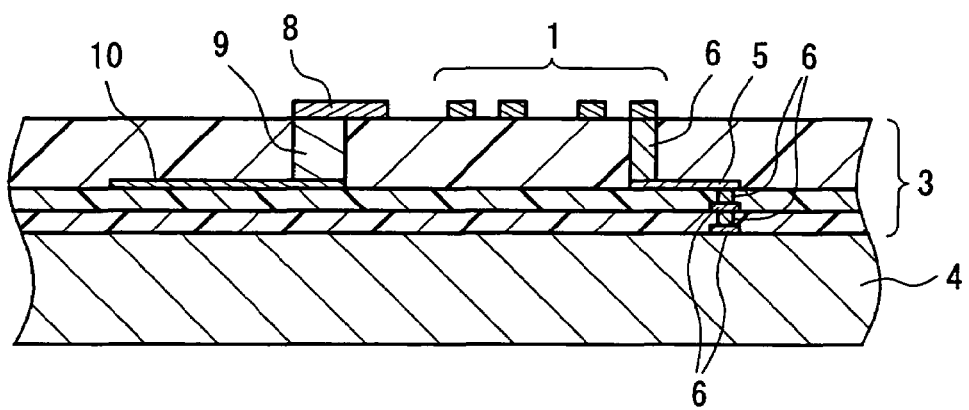
FIG. 2 is a cross-sectional view taken along line A–A' of FIG. 1.
Figure 3:
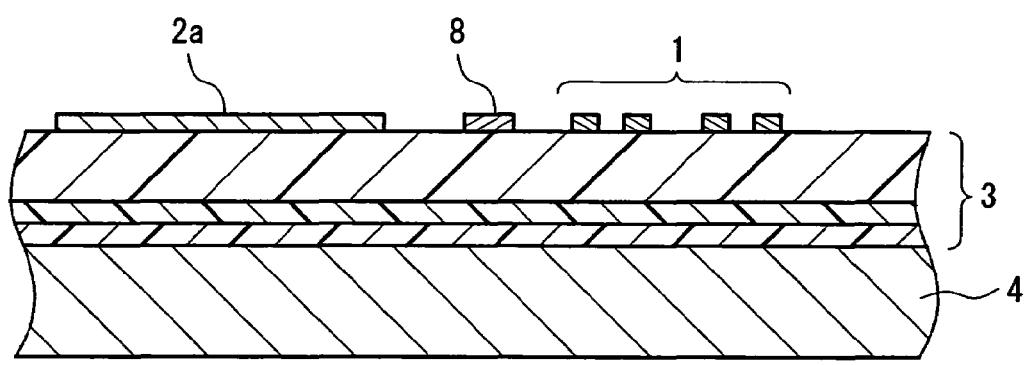
FIG. 3 is a cross-sectional view taken along line B–B' of FIG. 1.

FIGS. 1 to 3 show a semiconductor device according to Embodiment 1. FIG. 1 is a top plan view of the semiconductor device. FIG. 2 is a cross-sectional view taken along line A–A' of FIG. 1 and FIG. 3 is a cross-sectional view taken along line B–B' of FIG. 1. In the following descriptions, the same reference numerals are assigned to the same elements as those in the conventional example.

In FIG. 1, reference numeral 1 denotes a spiral inductor, around which connection terminals 2a, 2b and 2c leading to a printed board or the like are disposed. The connection terminals 2a and 2b each are connected with input/output terminals 13, 14 for an electrical signal, and the connection terminal 2c is connected with the ground. The spiral inductor 1 is connected with a circuit block 7 by way of a wiring 5 and a via 6 for the interlayer connection of the wiring layer.

As shown in FIG. 2, the wiring 5 and the via 6 are formed at a multilayered wiring region 3 including a wiring layer and an insulation layer that are provided on a semiconductor substrate 4. In the semiconductor substrate 4, circuit blocks are formed, which are not illustrated. As shown in FIG. 3, the spiral inductor 1 and the connection terminals 2a, 2b and 2c (FIG. 3 illustrates the connection terminal 2a only) are disposed on an upper surface of the multilayered wiring region 3.

Reference numeral 8 denotes a shielding wiring pattern, which is connected with a wiring 10 by way of a via 9. The shielding wiring pattern 8 is connected with a low impedance point such as the ground by way of the wiring 10. As shown in FIG. 1, the shielding wiring pattern 8 is disposed in a planar configuration so as to intervene between the spiral inductor 1 and the connection terminals 2a and 2b.

In the above-stated configuration, the connection terminals 2a and 2b are portions through which input/output signals pass, and when a signal passes therethrough, a change in electrical field occurs around these portions due to the change in their electric potentials. This change in electrical field significantly affects the wirings with a large impedance. Since spiral inductors are used mainly for a load, a resonant element and a choke inductor and have large impedance, they are susceptible to a change in electrical potential.

As a remedy for this situation, the shielding wiring pattern 8 allows the influence of noise and an unnecessary signal on the spiral inductor 1 to be alleviated effectively. That is to say, even when the electrical field changes, the provision of the low-impedance shielding wiring pattern 8 between the spiral inductor 1 and the connection terminals 2a and 2b, which are the source for the change in electrical potential, can alleviate the influence of the change on the spiral inductor 1. Nevertheless, since the shielding wiring pattern 8 is configured simply to intervene between the spiral inductor 1 and the connection terminals 2a and 2b, the area occupied thereby can be saved, thus not impairing the flexibility of the wirings.

EMBODIMENT 2

Figure 4:
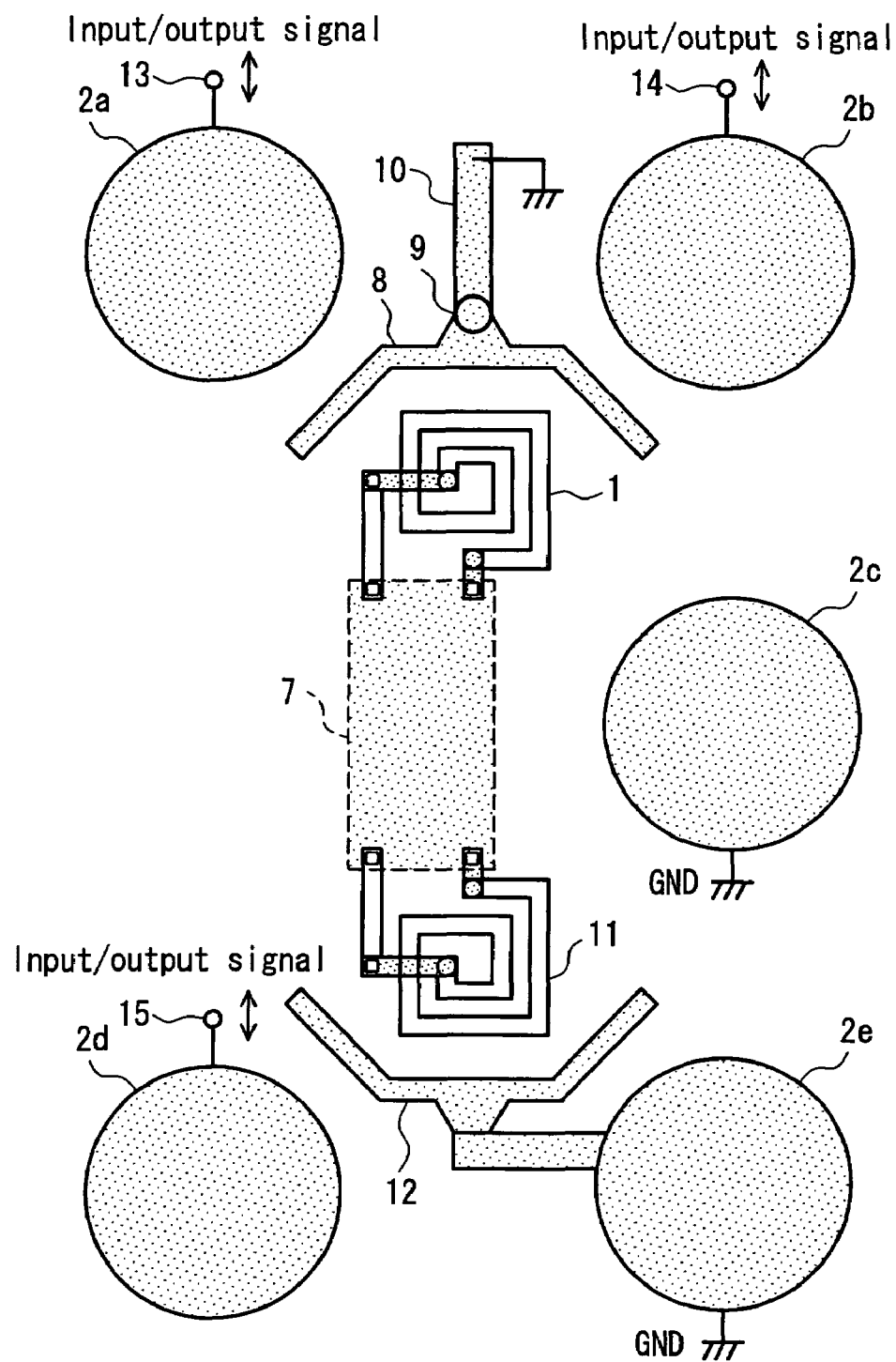
FIG. 4 is a plan view of a semiconductor device according to Embodiment 2 of the present invention.

FIG. 4 is a top plan view of a semiconductor device according to Embodiment 2 of the present invention. The same reference numerals are assigned to the same elements as those of Embodiment 1 shown in FIG. 1 so as to simplify the explanations.

In the present embodiment, as shown in FIG. 4, a spiral inductor 1 and a spiral inductor 11 are arranged to be symmetric with respect to a line. The spiral inductors 1 and 11 are connected with a differential circuit. In the vicinity of the spiral inductor 11, connection terminals 2d and 2e are disposed, through which connection with an external terminal of the semiconductor device is established. Between the spiral inductor 11 and the connection terminals 2d and 2e, a shielding wiring pattern 12 is disposed. The connection terminal 2d is connected with an electrical signal input/output terminal 15, and the connection terminal 2e is connected with the ground and also with the shielding wiring pattern 12.

The present embodiment has shielding effects against the electrical potential change of the connection terminals 2a, 2b, 2d and 2e that are similar to those of Embodiment 1. The present embodiment further has a wiring layout that keeps the symmetry between the spiral inductors 1 and 11 that are connected with the differential circuit as well as between their shielding wiring patterns 8 and 12.

When the symmetry of the circuit layout deteriorates, a differential signal generates a phase shift, which becomes a cause of the deterioration of properties. Therefore, by keeping the symmetry of the shielding wiring patterns 8 and 12 as well as of the spiral inductors 1 and 11, properties of the differential circuit can be maintained effectively.

Note here that the connection terminals shown in Embodiments 1 and 2 may be different in arrangement, shape and assignment depending on the use, the size and the input/output signals of the semiconductor device. The important thing is to allow a shielding wiring pattern to intervene between a spiral inductor and a connection terminal that is a target of suppressing the interference with the spiral inductor.

EMBODIMENT 3

Figure 5:
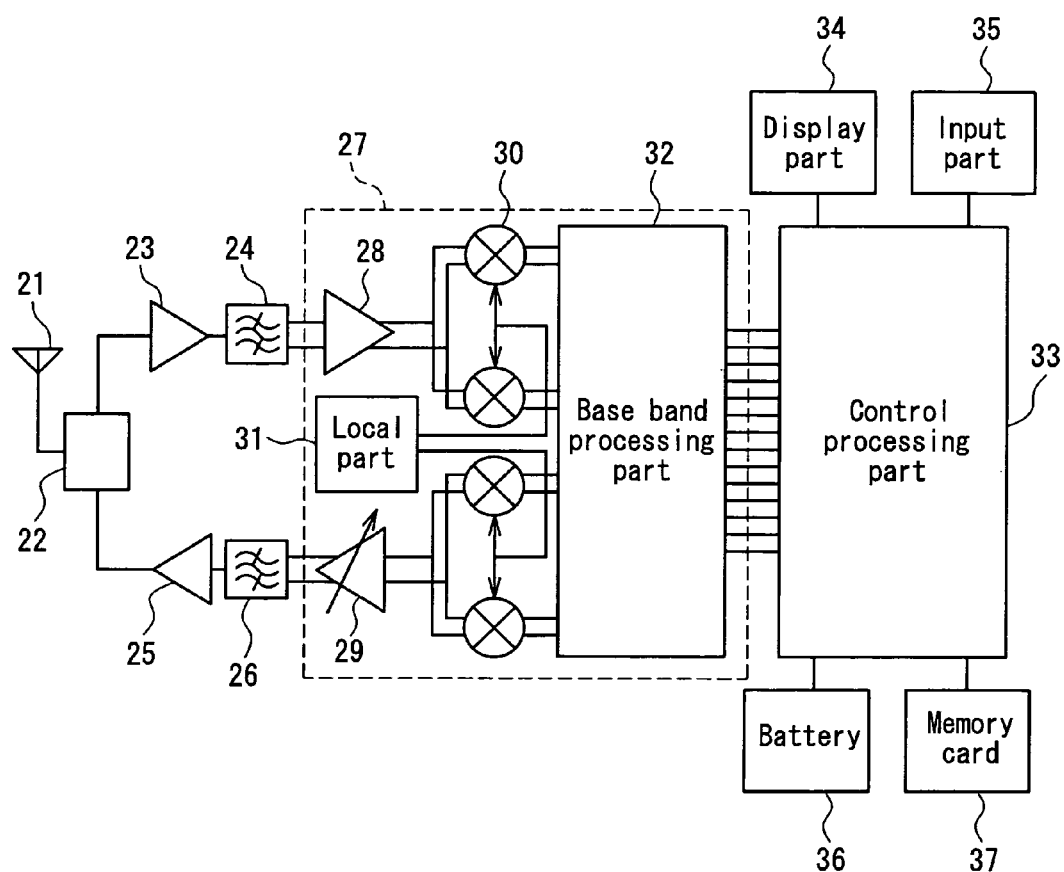
FIG. 5 is a block diagram of radio equipment according to Embodiment 3 of the present invention.
Figure 6:
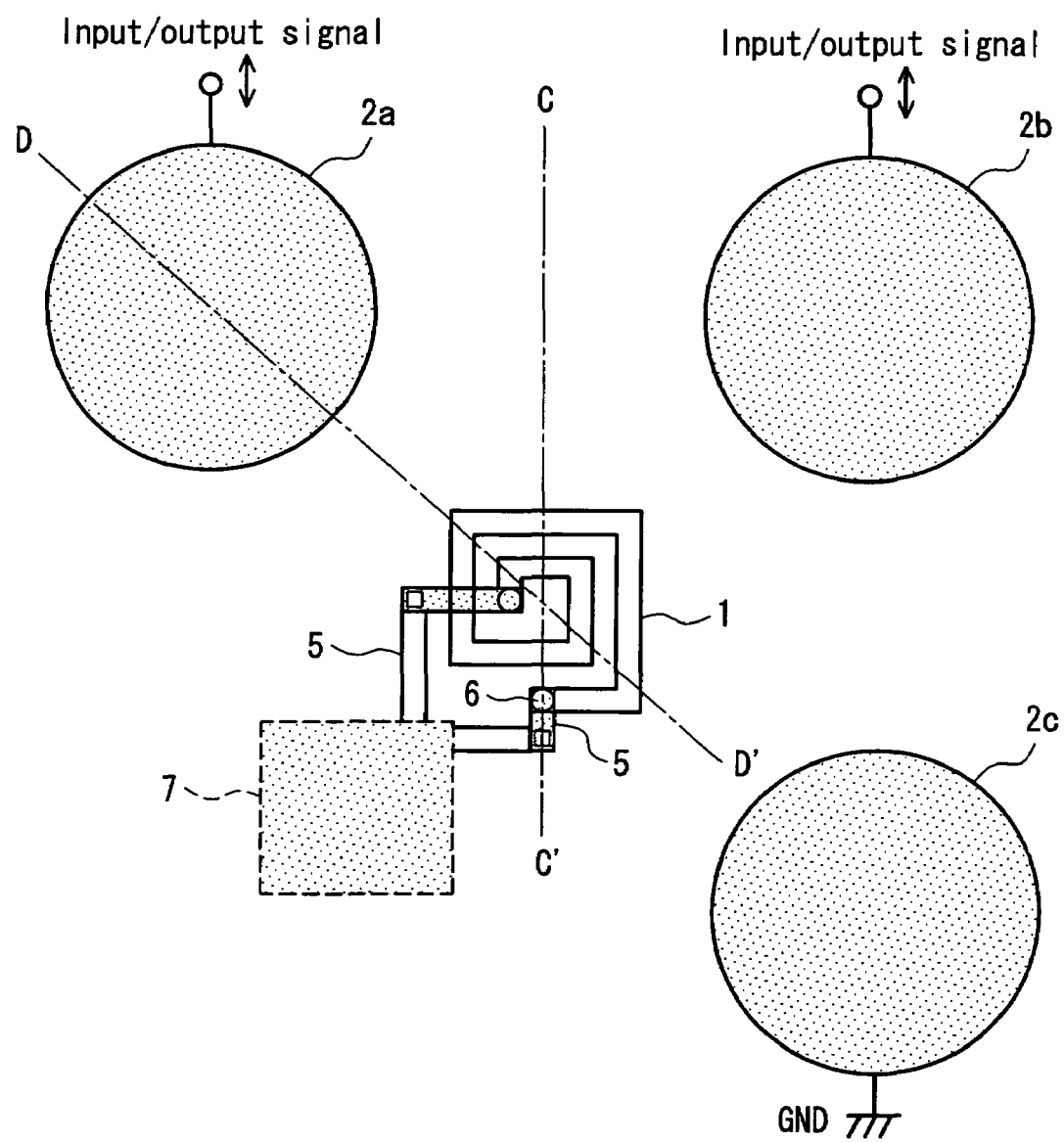
FIG. 6 is a plan view of a conventional semiconductor device.
Figure 7:
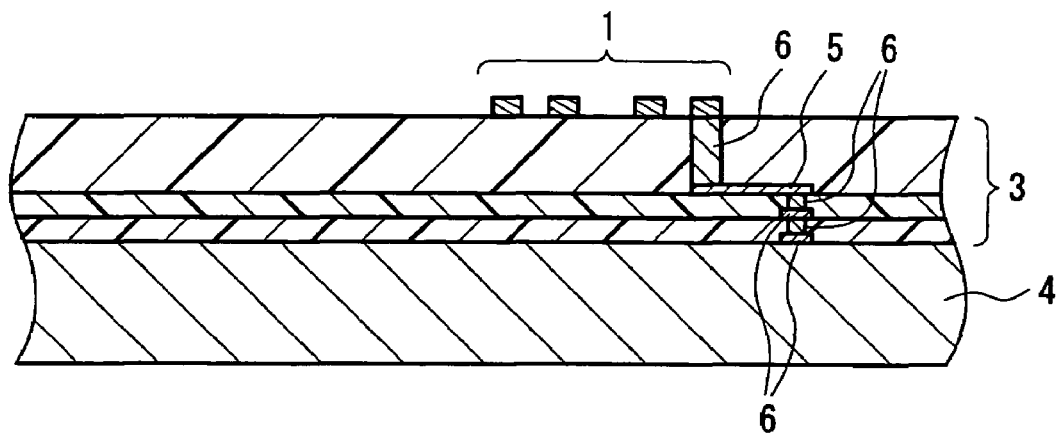
FIG. 7 is a cross-sectional view taken along line C–C' of FIG. 6.
Figure 8:
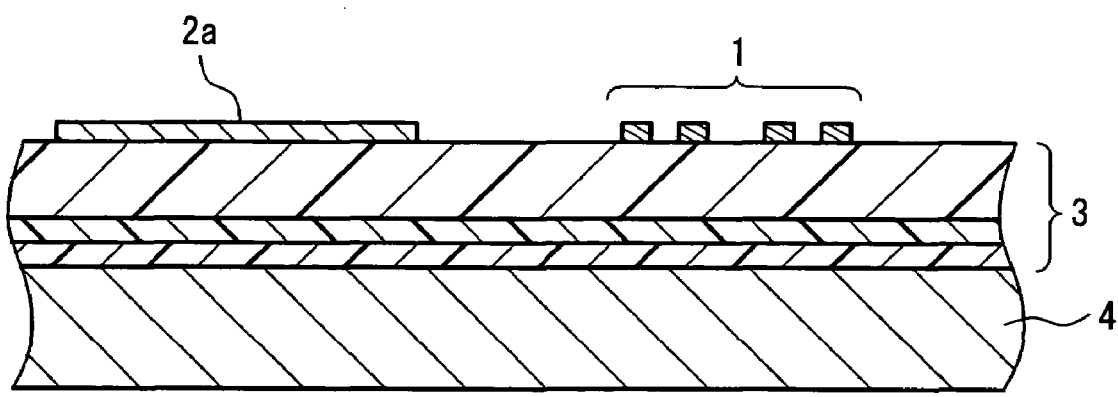
FIG. 8 is a cross-sectional view taken along line D–D' of FIG. 6.

FIG. 5 is a block diagram of radio equipment according to Embodiment 3 of the present invention. The present embodiment shows one example in which the combination of the spiral inductor and the shielding wiring pattern that are configured similarly to the above-described embodiments is applied to a semiconductor device 27 constituting a part of the radio equipment.

A signal is input from the outside to the semiconductor device 27 by way of an antenna 21, a transfer switch 22, a low noise amplifier 23, a filter 24, a power amplifier 25 and a filter 26, and a signal is output to the outside from the semiconductor device 27. The semiconductor device 27 is made up of an amplifier 28, a gain control amplifier 29, a mixer 30, a local part 31, a base band processing part 32 and the like. The semiconductor device 27 performs input/output of signals with respect to a control processing part 33. The control processing part 33 is connected with a display part 34, an input part 35, a battery 36, a memory card 37 and the like.

The use of the configurations of the above-described embodiments as the semiconductor device 27 allows small radio equipment that is stable from interference to be attained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
   a semiconductor substrate in which a semiconductor element is formed;
   multilayer wiring layers that are provided on the semiconductor substrate, for forming a structure connected with the semiconductor element;
   a spiral inductor that is formed of at least one layer of the multilayer wiring layers;
   a connection terminal that is formed of an uppermost layer of the multilayer wiring layers; and
   a shielding wiring pattern that is formed of the uppermost layer of the multilayer wiring layers and is disposed between the spiral inductor and the connection terminal to shield the spiral inductor from an electrical field change caused by an electrical potential change due to input and output signals that pass through the connection terminal.

2. The semiconductor device according to claim 1, wherein the spiral inductor is formed of the uppermost layer of the multilayer wiring layers.

3. The semiconductor device according to claim 1, wherein the shielding wiring pattern is grounded.

4. A semiconductor device, comprising:
   a semiconductor substrate in which a semiconductor element is formed;
   multilayer wiring layers that are provided on the semiconductor substrate, for forming a structure connected with the semiconductor element;
   first and second spiral inductors that are formed of at least one layer of the multilayer wiring layers and arranged to be symmetric in planar disposition with respect to a predetermined center line;
   a first connection terminal that is formed of an uppermost layer of the multilayer wiring layers and placed in the vicinity of the first spiral inductor;
   a second connection terminal that is formed of the uppermost layer and placed in the vicinity of the second spiral inductor; and
   first and second shielding wiring patterns that are formed of the uppermost layer and arranged to be symmetric in planar disposition with respect to the predetermined center line, the first shielding wiring pattern being disposed between the first spiral inductor and the first connection terminal, and the second shielding wiring pattern being disposed between the second spiral inductor and the second connection terminal;
   wherein the first and second shielding wiring patterns shield respectively the first and second spiral inductors from electrical field changes caused by electrical potential changes due to input and output signals that pass through the first and second connection terminals.

5. The semiconductor device according to claim 4, wherein the first and second spiral inductors are formed of the uppermost layer.

6. The semiconductor device according to claim 4, wherein the first and second spiral inductors are connected to a differential circuit.

7. The semiconductor device according to claim 4, wherein the first and second shielding wiring patterns are grounded.

* * * * *